Figure 1:
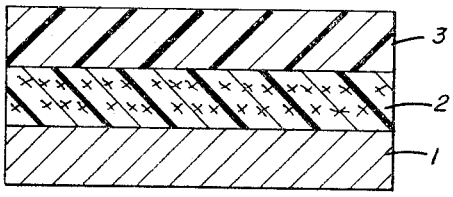
Figure 2:
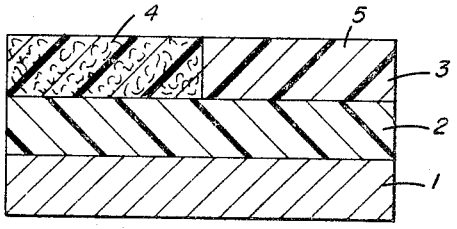
Figure 3:
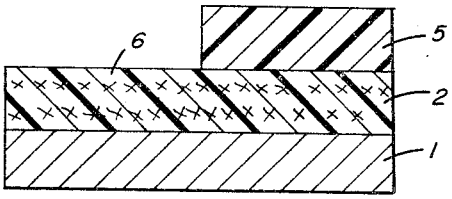
Figure 4:
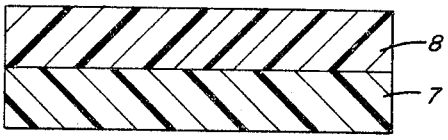
Figure 5:
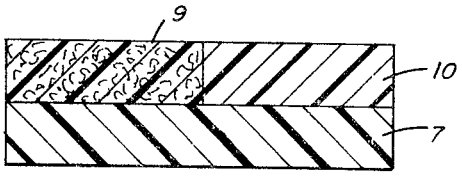
Figure 6:
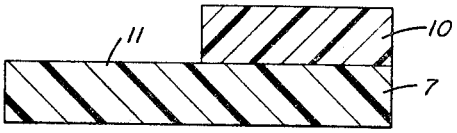

T 867012

DEFENSIVE PUBLICATION

UNITED STATES PATENT OFFICE

Published at the request of the applicant or owner in accordance with the Notice of Apr. 11, 1968, 849 O.G. 1221. Identification is by serial number of the application and the heading indicates the number of pages of specification, including claims, and of sheets of drawing contained in the application as originally filed. The file of this application is available to the public for inspection; reproduction may be purchased for 30 cents per sheet.

Applications published under the Defensive Publication Program have not been examined as to the merits of alleged invention. The Patent Office makes no assertion as to the novelty of the disclosed subject matter.

PUBLISHED OCTOBER 21, 1969

867 O.G. 749

833,274
PRINTING PLATES AND METHOD OF PREPARING SAME

Robert Newell Woodward and Joe Ellis South, both %
Eastman Kodak Company, Rochester, N.Y. 14650

Filed June 16, 1969. Published Oct. 21, 1969
Int. Cl. G03c *5/00;* B44m *5/00;* G03f *7/02*
U.S. Cl. 96—36.3
1 Sheet Drawing. 21 Pages Specification

A printing plate is prepared by removing, by an etch-bleach technique, developed, silver image-bearing portions of a hardened gelatino silver halide emulsion such as a negative, or positive or high contrast predominately silver chloride emulsion layer provided over a layer of an oleophilic synthetic resin such as polystyrene, polyvinylbutyral, acrylic esters, vinyl and vinylidene resins, cellulose esters, polyvinyl acetate, etc. The oleophilic resin layer may be organic solvent soluble and contain a coloring agent therein thus providing a printing plate containing its own ink supply. Alternatively, the resin layer may be used to provide oleophilic portions and the remaining hardened gelatin portions are hydrophilic.

T867012

833,274

Oct. 21, 1969 R. N. WOODWARD ET AL DEF. PUB.

PRINTING PLATES AND METHOD OF PREPARING SAME

Filed June 16, 1969

ROBERT N. WOODWARD
JOE E. SOUTH
INVENTORS

BY Henry E Byers
ATTORNEY